(12) United States Patent
Dvorak et al.

(10) Patent No.: US 6,535,989 B1
(45) Date of Patent: Mar. 18, 2003

(54) INPUT CLOCK DELAYED BY A PLURALITY OF ELEMENTS THAT ARE CONNECTED TO LOGIC CIRCUITRY TO PRODUCE A CLOCK FREQUENCY HAVING A RATIONAL MULTIPLE LESS THAN ONE

(75) Inventors: Josef A Dvorak, Fort Collins, CO (US); Ricky L Pettit, Loveland, CO (US); David B Hollenbeck, Windsor, CO (US); Kent R Townley, San Jose, CA (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/471,462

(22) Filed: Dec. 22, 1999

(51) Int. Cl.$^7$ .............................. G06F 1/04; G06F 1/06; G06F 1/08
(52) U.S. Cl. .................... 713/500; 713/322; 713/401; 713/400; 713/501
(58) Field of Search ................. 713/500, 401, 713/322, 501, 400

(56) References Cited

U.S. PATENT DOCUMENTS

| | | | | |
|---|---|---|---|---|
| 4,958,276 A | * | 9/1990 | Kiuchi et al. | 711/167 |
| 5,287,296 A | * | 2/1994 | Bays et al. | 377/47 |
| 5,572,719 A | * | 11/1996 | Biesterfeldt | 713/500 |
| 5,859,999 A | | 1/1999 | Morris et al. | 395/565 |
| 5,860,017 A | | 1/1999 | Sharangpani et al. | 395/800.23 |
| 5,915,107 A | * | 6/1999 | Maley et al. | 713/400 |
| 6,157,694 A | * | 12/2000 | Larsson | 327/115 |

OTHER PUBLICATIONS

Bechade, Housel, "Digital Delay Line Clock Shapers and Multipliers", IBM Journal of Research and Development, 39(1–2): 1995 (Jan.–Mar.).

Jain, Dil Sikh, "Circuit Devides Frequency by Half Integers", Electronics Test, 5(1): Jan. 1982.

Dabral, Maloney, Basic ESD and I/O Design, Section 4.5.2, 1998, John Wiley and Sons, Oct. 1999.

Maneatis, JG, "Low–Jitter Process–Independent DLL and PLL Based on SEL Biased Techniques", IEE Journal of Solid State Circuits, 31/11:Nov. 1996.

Wolfe, A., "Patents shed light on Merced's Innards", Electronic Engineering Times, Feb. 15, 1999.

* cited by examiner

*Primary Examiner*—Thomas Lee
*Assistant Examiner*—Michael Nieves (57) ABSTRACT

An apparatus for producing one or more clock signals comprises a plurality of delay elements sequentially connected and logic circuitry connected to several of the plurality of delay elements. A clock signal fed through the plurality of delay elements produces multiple delayed versions of the clock signal. Logic circuitry selects and combines the delayed clock signal versions to produce one or more output clock signals, each having a frequency that is a selected fraction of the input clock signal. An associated method delays the input clock signal N times sequentially for a natural number N. then selects a series of time splices of the delayed clock signals to produce an output clock signal. In some implementations the input clock signal can be referenced to a reference clock signal. The output clock signal frequency can be set to $(N/M) \times f_{ref}$, for a natural number M and reference clock signal frequency $f_{ref}$. The apparatus and associated method can flexibly produce a large variety of output clock frequencies and frequency ratios, lock to $f_{ref}$ with a dynamic response independent of the output frequency range and can be optimized to a single reference frequency, need not relock to change output frequency, and reduce clock skew.

22 Claims, 8 Drawing Sheets

INPUT CLOCK DELAYED BY A PLURALITY OF ELEMENTS THAT ARE CONNECTED TO LOGIC CIRCUITRY TO PRODUCE A CLOCK FREQUENCY HAVING A RATIONAL MULTIPLE LESS THAN ONE

TECHNICAL FIELD

The invention relates to clock signals. More particularly, the invention relates to methods and equipment for producing one or more clock signals from delayed versions of a given clock signal.

BACKGROUND ART

Figure 1:
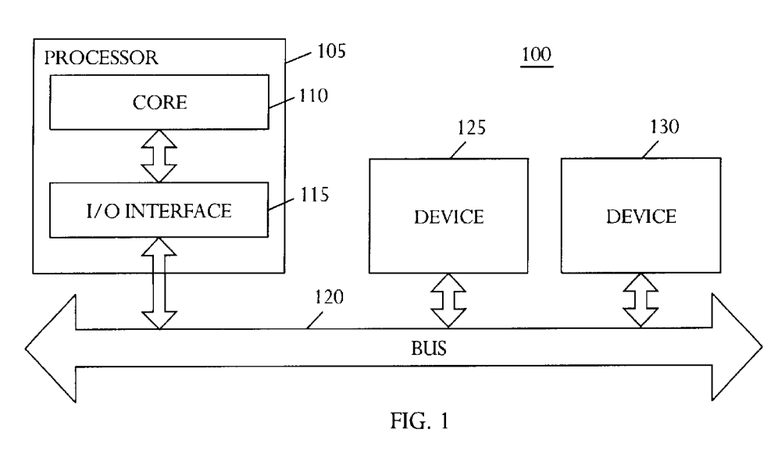
FIG. 1 is a simplified block diagram of a processor and its environment.

FIG. 1 is a simplified block diagram of a processor 105 and its environment 100. The processor 105 comprises a core 1 10 and an I/O interface 115. The I/O interface 115 connects the processor 105 to a bus 120. One or more other devices, such as the devices 125 and 130, are also connected to the bus 120. The other devices 125 and 130 may be storage devices, such as RAM memory or disk drives, peripherals, such as printers or data communication devices, or other processors, for example.

The processor core 110 is paced by a core clock. Rather than operating in a continuous manner, the processor core 110, like all digital electronic devices, operates discretely. The processor core 110 performs operations upon every cycle of the processor clock. The core clock is the "heartbeat" of the of the processor core 110. As used herein, the term "clock," refers to any signal having a periodic property. Clock signals used with digital electronics are typically periodic rectangular waveforms oscillating between two (binary) states ("1" and "0"), and the significant periodic property is typically a rising edge (i.e., the transition from "0" to "1") when edge sensitive clocking is utilized. The processor core 110 advances in operation every time there is a rising and/or falling edge on the core clock.

The bus 120 is paced by a bus clock, whose rate or frequency (the two words are synonymous in this context) is physically constrained to be slower than the core clock. Rather than letting the bus clock and the core clock run asynchronously, the frequency of the core clock is typically an integer multiple of the bus clock, and the bus and core clock are phase-locked in some way, such as, for example, every rising edge of the bus clock occurring approximately simultaneously with a rising edge of core clock. For example, the frequency of the core clock might be 1 GHz ($10^9$ cycles per second) and the frequency of the bus clock might be 250 MHz ($250 \times 10^6$ cycles per second), in which case the core-bus clock frequency ratio is four (or four-to-one, "4:1"). A faster core clock enables the processor 105 to operate more efficiently by performing several operations for each access to the bus 120. The slower bus clock can be generated from the faster core clock by frequency division. Frequency division, though very simple, is available only for cases in which the frequency ratio is an whole number. Alternatively, the faster core clock can be generated from the slower bus clock using a phase locked loop (PLL). Though a PLL can be designed to operate at almost any frequency ratio, a PLL works best for a single, fixed frequency ratio.

Challenges are encountered when the core-bus clock frequency ratio is not fixed. This situation may arise, for example, when the processor 105 is meant to be fielded in different environments 100, each environment 100 having a bus 120 that has a different maximum bus speed for some reason. For example, in one environment 100, the processor 105 may be the only processor on the bus 120, the core frequency might be 1 GHz and the bus frequency 250 MHz, in which case the core-bus clock frequency ratio would be four. In another environment 100, the device 125 may be another processor and the bus frequency would need to slow from 250 MHz to 125 MHz in order to handle both processors, resulting in a core-bus clock frequency ratio that is eight (or 16:2). In actual practice, the relationship between the number of processors on the bus 120 and the core-bus frequency ratio is often not as simple as the linear relationship just illustrated, but it is generally true that a greater number of processors on the bus 120 decreases the bus frequency and hence increases the core-bus clock frequency ratio. Thus, in a third environment 100 when the device 130 is a third processor, then the core-bus frequency ratio would be even higher (perhaps 12:1, 17:2 or 28:3, for example). This situation may arise, for example, when the number of processors on the bus 120 dynamically changes.

For a PLL to be able to handle variable core-bus clock frequency ratios, the frequency range of the PLL must be very large. This is undesirable because it results in a poorer dynamic response. It is also disadvantageous for the loop to have to re-lock every time the ratio is changed. Re-locking requires time for the PLL to settle to a new locked state. A poor dynamic response further slows settling and exacerbates the problem.

SUMMARY OF THE INVENTION

In one respect, the invention is an apparatus for producing one or more clock signals. The apparatus comprises a plurality of delay elements sequentially connected and logic circuitry connected to several of the plurality of delay elements. A clock signal is fed through the plurality of delay elements, producing several delayed versions of the clock signal. The logic circuitry selects and combines the delayed versions of the clock signal to produce one or more output clock signals, each having a frequency that is a desired rational multiple less than one (i.e., a fraction) of the frequency of the clock signal fed through the plurality of delay elements.

In another respect, the invention is a method of producing an output clock signal. Starting with a given clock signal, the method delays the given clock signal N times sequentially, where N is a natural number. The method then selects a series of time splices of the delayed clock signals, so as to produce the output clock signal. Optionally, the method can lock the given clock signal to a reference clock signal. The frequency of the output clock signal can be set to be $(N/M) \times f_{REF}$, where M is a natural number (i.e., positive integer) and $f_{REF}$ is the frequency of the reference clock signal. The reference signal may be a processor core clock signal, and the output clock signal may be an external I/O clock signal.

In comparison to other solutions, certain embodiments of the invention are capable of achieving certain advantages, including the following: (1) certain embodiments can flexibly produce a large variety of output clock frequencies and frequency ratios; (2) in locking arrangements, the dynamic response is independent of the output frequency range and can be optimized to a single reference frequency; (3) certain embodiments need not re-lock to produce a different output frequency; (4) the circuitry of certain embodiments requires less area than a PLL; and (5) certain embodiments offer improved ability to decrease clock skew across a processor or other digital electronic device.

Those skilled in the art will appreciate these and other advantages and benefits of various embodiments of the invention upon reading the following detailed description of a preferred embodiment with reference to the drawings.

DETAILED DESCRIPTION OF A PREFERRED EMBODIMENT

Figure 2:
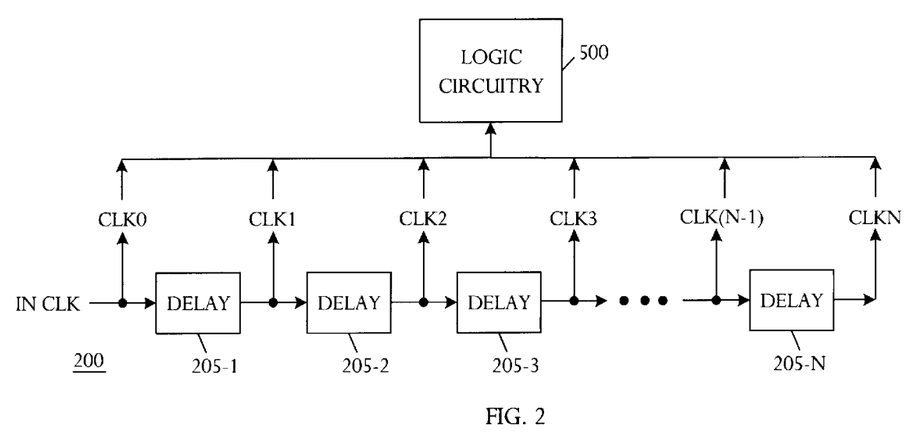
FIG. 2 is a block diagram of a general tapped delay line.

One embodiment of the invention utilizes a tapped delay line to generate several delayed versions of a clock signal. FIG. 2 is a block diagram of a general tapped delay line 200. The tapped delay line 200 comprises a number ("N") of delay elements 205-1, 205-2, 205-3, . . . , 205-N. The delay elements 205 are sequentially connected such that the output of one delay element 205 is the input to the next delay element 205 in the line 200. A clock signal IN CLK is input to the tapped delay line 200 at the first delay element 205-1. Outputs are tapped from the line 200 at one or more inputs or outputs along the line 200. Preferably, one output is tapped from the input of the first delay element 205-1 and from the outputs of every delay element 205-1, 205-2, 205-3, . . . , 250-N. Preferably, each delay element 205-1, 205-2, 205-3, . . . , 250-N provides an identical delay $\Delta T$. As functions of time, then, CLK1(t)=IN CLK(t−$\Delta T$), CLK2(t)= IN CLK(t−2$\Delta T$), CLK2(t)=IN CLK(t−3$\Delta T$), . . . , CLKN (t)=IN CLK(t−N$\Delta T$). A delay element 205 can be implemented physically as a self-biased analog delay element, which is known in the art (see, e.g., Maneatis, J. G., "Low-Jitter Process-Independent DLL and PLL Based on Self-Biased Techniques, IEEE Jrnl. Solid State Circuits, vol. 31, no. 11, November 1996). As explained in greater detail below, the invention operates upon the outputs tapped from the delay line 200 to produce one or more clock signals having various frequency ratios to the clock signal IN CLK.

Other circuit architectures for producing delay versions of the clock signal IN CLK are possible. For example, whereas the delay elements 205 are arranged in series in the tapped delay line 200, a parallel arrangement is also possible. The clock signal IN CLK can be input to N parallel delay elements, each providing a slightly different delay, to produce the same set of output signals. Hybrid series-parallel circuits are also possible.

Figure 3:
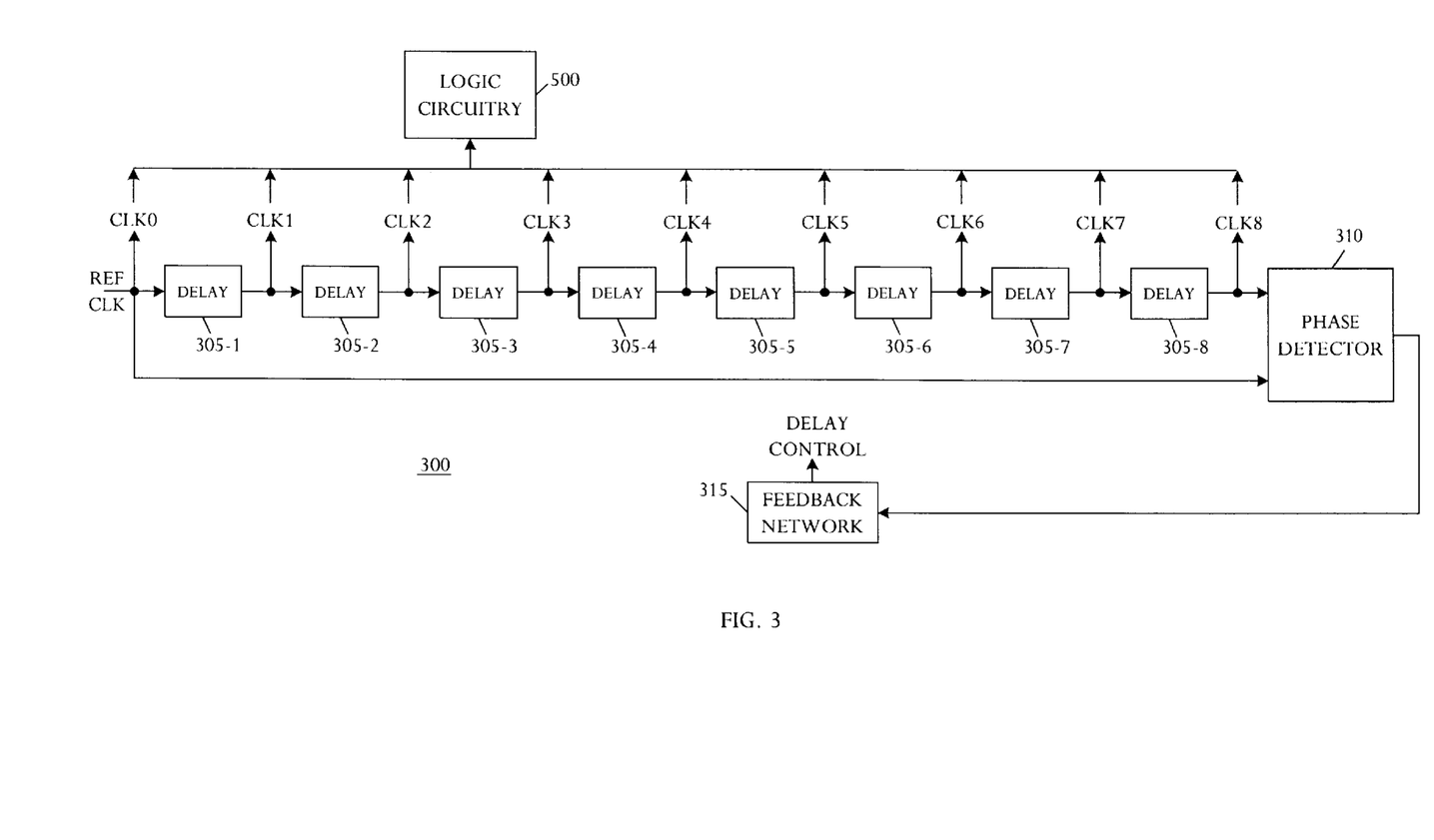
FIG. 3 is a block diagram of a delay locked loop with an eight-stage delay line.

In preferred embodiments, the input clock signal IN CLK is a reference clock signal or locked to a reference clock signal. FIG. 3, for example, shows, in part, an eight stage tapped delay line, to which the input clock signal is a reference clock. FIG. 3 is a block diagram of a delay locked loop (DLL) 300. Nominally, each delay element 305 delays its input signal by one-eighth of the period or cycle (the two words are synonymous in this context) of the input signal REF CLK. Therefore, in its settled state, the signal CLK8 is identical to the input signal REF CLK. Both the signals CLK8 and REF CLK are input to a phase detector 310. When the signals CLK8 and REF CLK are indeed identical, the phase detector 310 detects zero phase difference and, consequently, produces zero output. If, however, each delay element provides too little or too much delay, so that the signal CLK8 lags or leads, respectively, REF CLK, then the phase detector 310 detects the phase difference and produces an output signal of appropriate polarity so that a feedback network 315 increases or decreases the delays, respectively, so as to bring the DLL 300 to its locked state.

Figure 4:
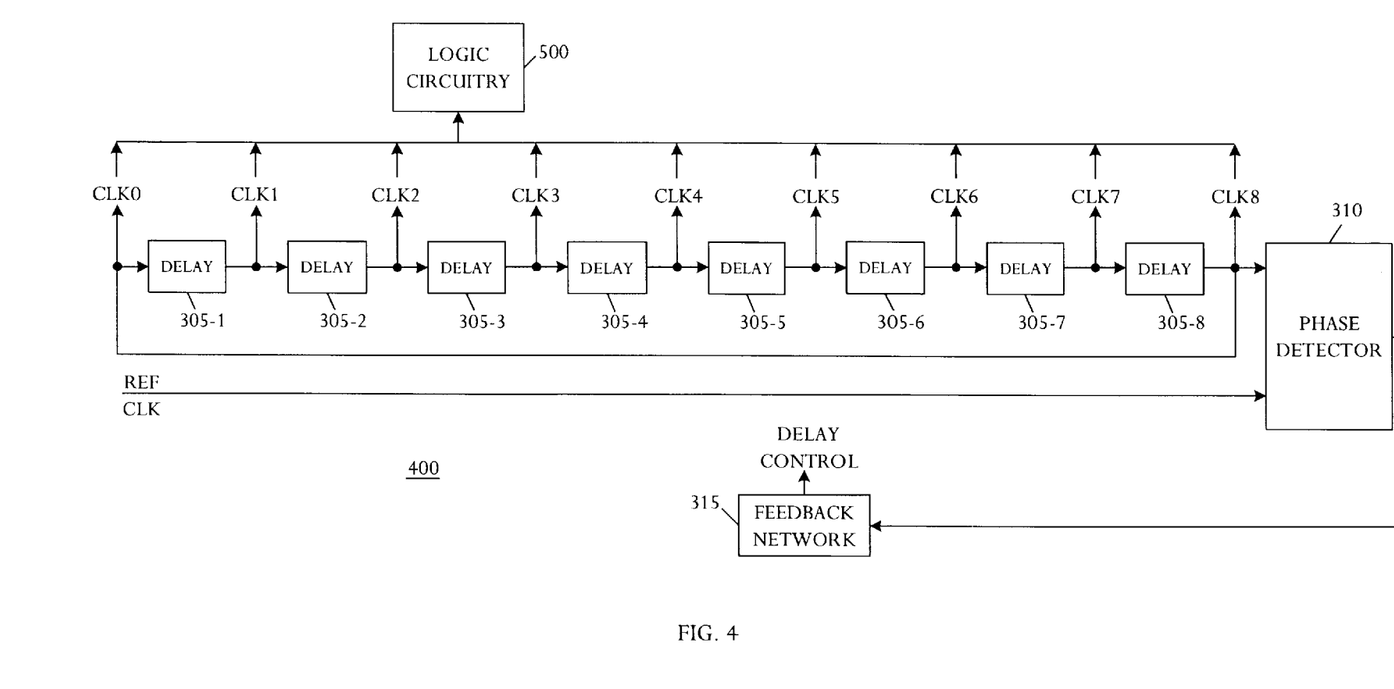
FIG. 4 is a block diagram of a phase locked loop with an eight-stage delay line.

FIG. 4 depicts a variation of what is shown in FIG. 3. Rather than a DLL, FIG. 4 shows a PLL 400. The PLL 400 operates similarly to the DLL 300. Because each delay element 305 delays its input signal by one-eighth of the period of the input signal REF CLK, the loop gain of the loop formed by the connection of the eight delay elements 305-1, 305-2, . . . , 305-8 is unity, resulting in an oscillator at the frequency of the signal REF CLK.

Figure 5:
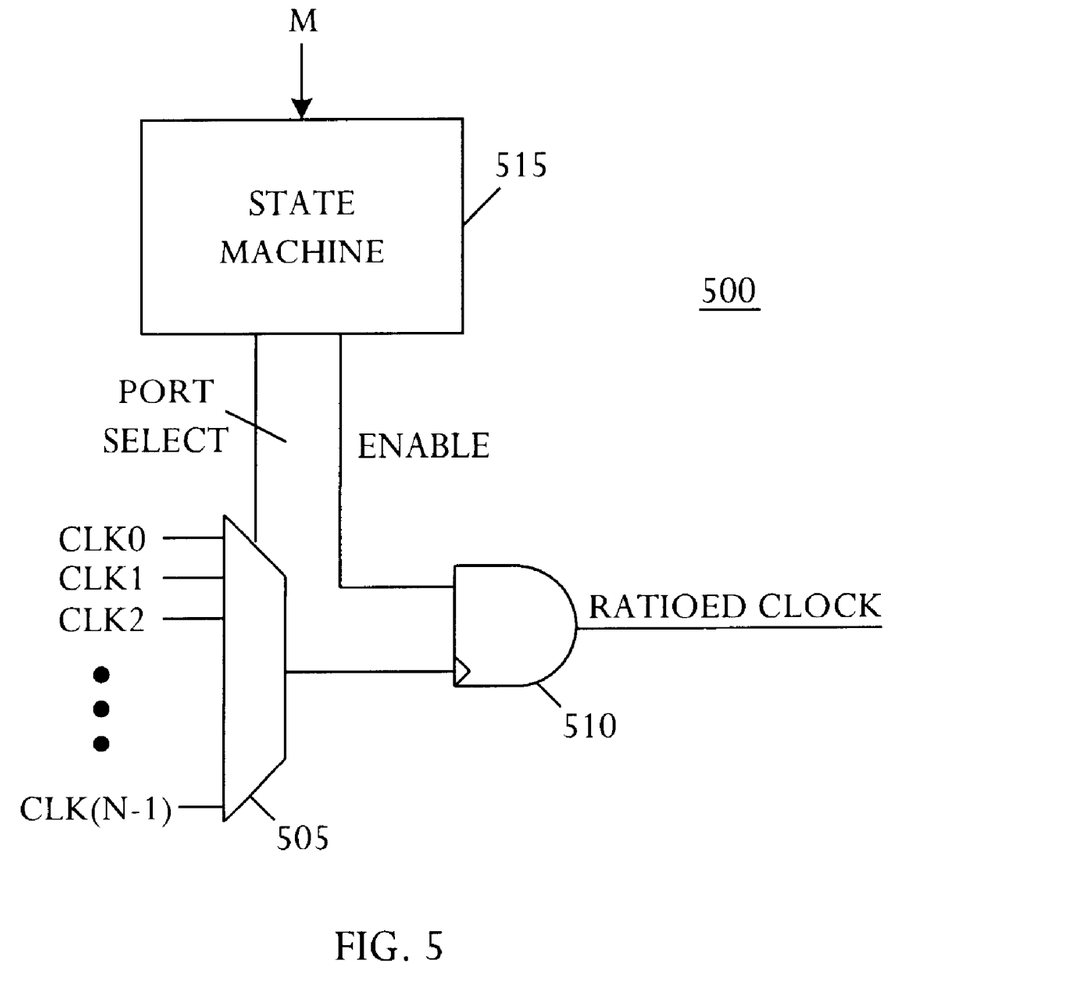
FIG. 5 is a block diagram of digital circuitry for use with a tapped delay line.

FIG. 5 is a block diagram of digital circuitry 500 for use with a tapped delay line or other circuit producing several delayed versions of a clock signal. Referring back to the general tapped delay line 200 (FIG. 2), the input signals to the digital circuitry 500 are the outputs CLK0, CLK1, CLK2, . . . , CLKN tapped from the delay line 200. In operation, the clock signals CLK0, CLK1, CLK2, . . . , CLKN are input into an N-to-1 multiplexor 505. The output of the multiplexor 505 at any given time is one of the N input signals. One or more port select lines control which one of the input signals is passed to the output of the multiplexor 500. The selected signal from the multiplexor 500 is logically combined with an enable signal at an enable gate 510, to produce a ratioed clock signal. The port select line(s) and enable signal are produced by a state machine 515. The digital circuitry 500 performs the function of selecting a series of time splices of the clock signals CLK0, CLK1, CLK2, . . . , CLKN, so as to produce output clock signals, as the example below illustrates.

Figure 6:
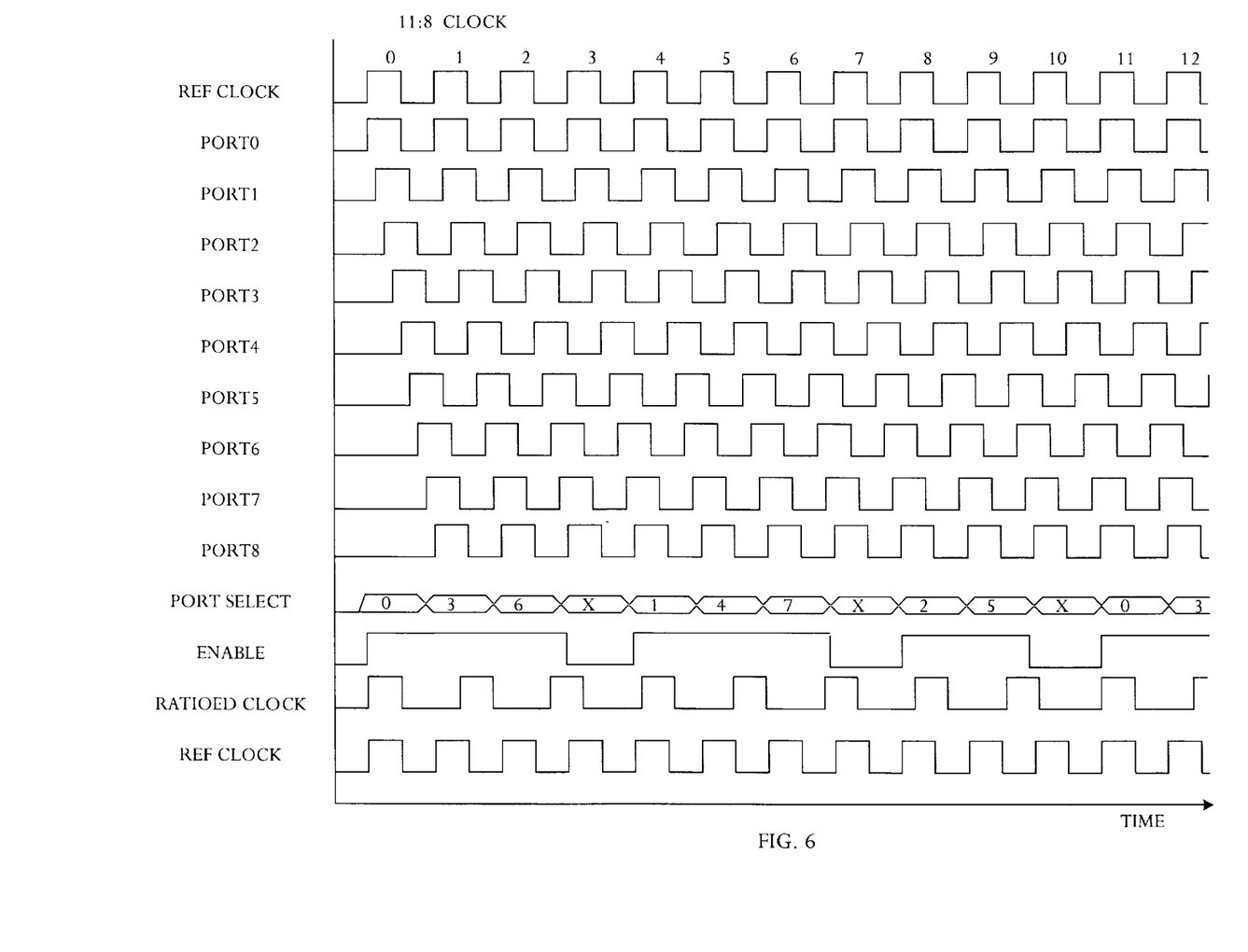
FIGS. 6–8 are signal diagrams showing the production of various ratioed clock signals.

FIG. 6 is a set of signal diagrams that illustrate the production of a clock signals having a frequency ratio of 11:8 with respect to a reference clock (i.e., $f_{REF}/f_{RAT}=11/8$ where $f_{REF}$ and $f_{RAT}$ are the frequencies of the reference and ratioed clock signals, respectively). The signals of FIG. 6 result from the combination of either the DLL 300 (FIG. 3) or the PLL 400 (FIG. 4) in combination with the digital circuitry 500 (FIG. 5) where N=8. The top waveform is the clock signal REF CLK. The next signal, which is input to port number 0 of the multiplexor 500, is CLK0, which is the same as the clock signal REF CLK. The next seven clock signals, which are input to ports numbers 1–7 of the multiplexor 500, are CLK1, CLK2, . . . , CLK7. The next clock signal is CLK8, which is not input to the multiplexor 500, because it is equivalent to CLK0. (Alternatively, CLK8 could be input to the multiplexor 500 and CLK0 not used.) As FIG. 6 shows, each signal is delayed from the preceding one by one-eighth of the period of the signal REF CLK. The temporal relationship can be visualized by imagining that the signals in FIG. 6 propagate from right to left, so that the positive pulses 0, 1, 2, . . . of the signal REF CLK arrive a destination on the left side in that order. Because the signals input to the multiplexor 500 jointly have rising edges and falling edges everywhere within a resolution of one-eighth of the period of the signal REF CLK, it is possible to manipulate the port select line(s) of the multiplexor 500 in such a way as to pick any desired rising and/or falling edges from the possibilities presented, and thus synthesize a desired output clock. In FIG. 6, the port selections are such that every eleventh rising edge is selected. As can be seen, the corresponding sequence of port selection of the multiplexor 500 is "0, 3, 6, X, 1, 4, 7, X, 2, 5, X," where X is a "don't care" state (because the enable line is low then). The port selection sequence "0, 3, 6, X, 1, 4, 7, X, 2, 5, X" is repeated until a different ratio is chosen. Note that the port selection sequence repeats every eleven cycles of the reference clock REF CLK, consistent with the ratio 11:8 in this case. In general, if the ratio is M:8, then the port selection sequence will be periodic with period M or less.

FIG. 6 illustrates how the multiplexor 500 output is logically combined with an enable signal at the enable gate 510. The enable signal is sampled at the rising edge (left side of a positive pulse, e.g., those numbered 0, 1, 2, . . . on REF CLK) of the multiplexor 500 output. If the enable signal is high at the time of the rising edge, then the entire positive pulse from the multiplexor 500 output is passed through the enable gate 510. When the enable signal is low, then the output of the enable gate 510 is held low, regardless of the presence of a rising edge at the output of the multiplexor 500. Thus, the enable gate 500 is similar to an AND gate, but unlike a conventional AND gate, which is level sensitive, the enable gate 500 is edge sensitive in the sense just described (i.e., sensitive to the rising edge of the output of the multiplexor 500).

Figure 7:
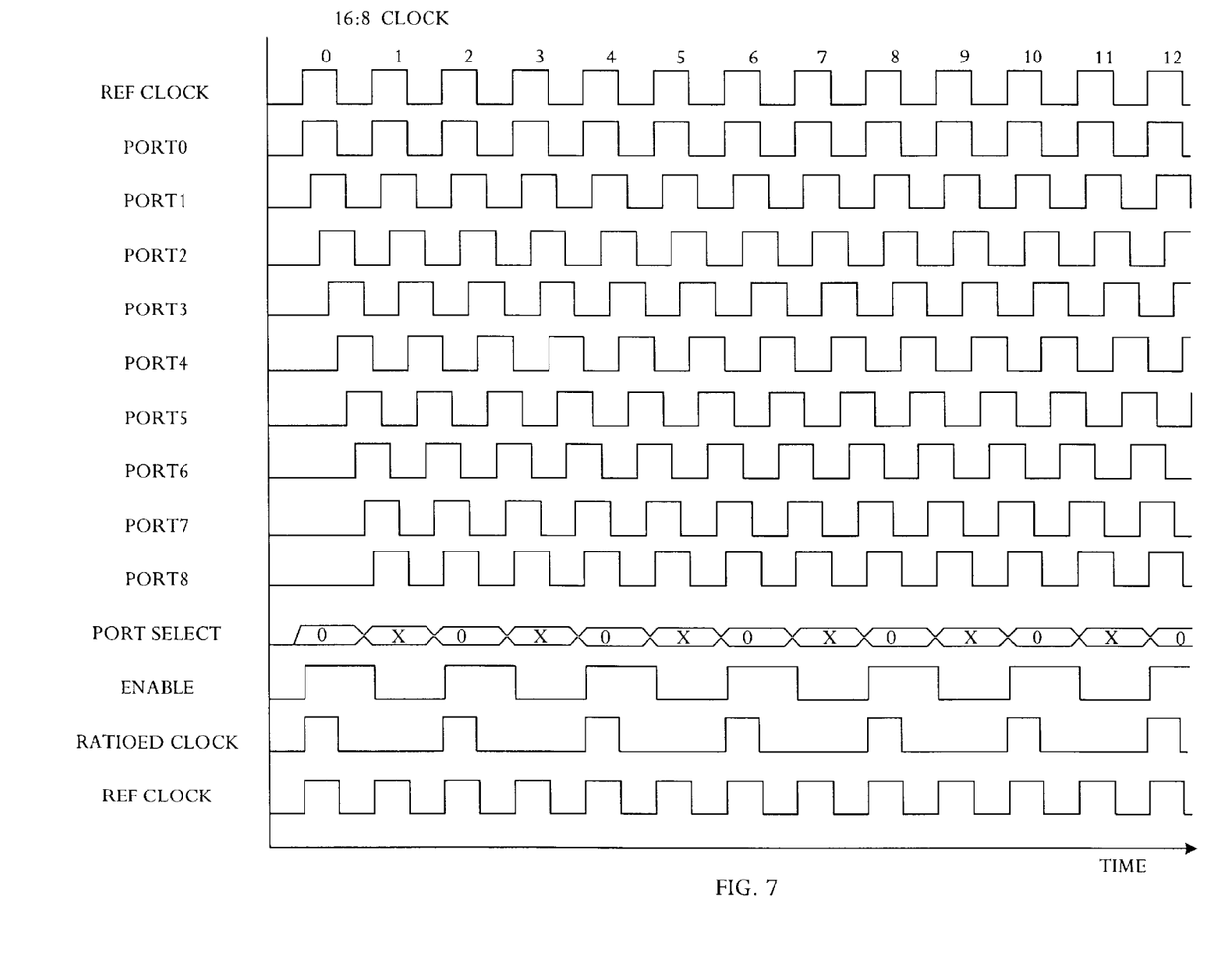
Figure 8:
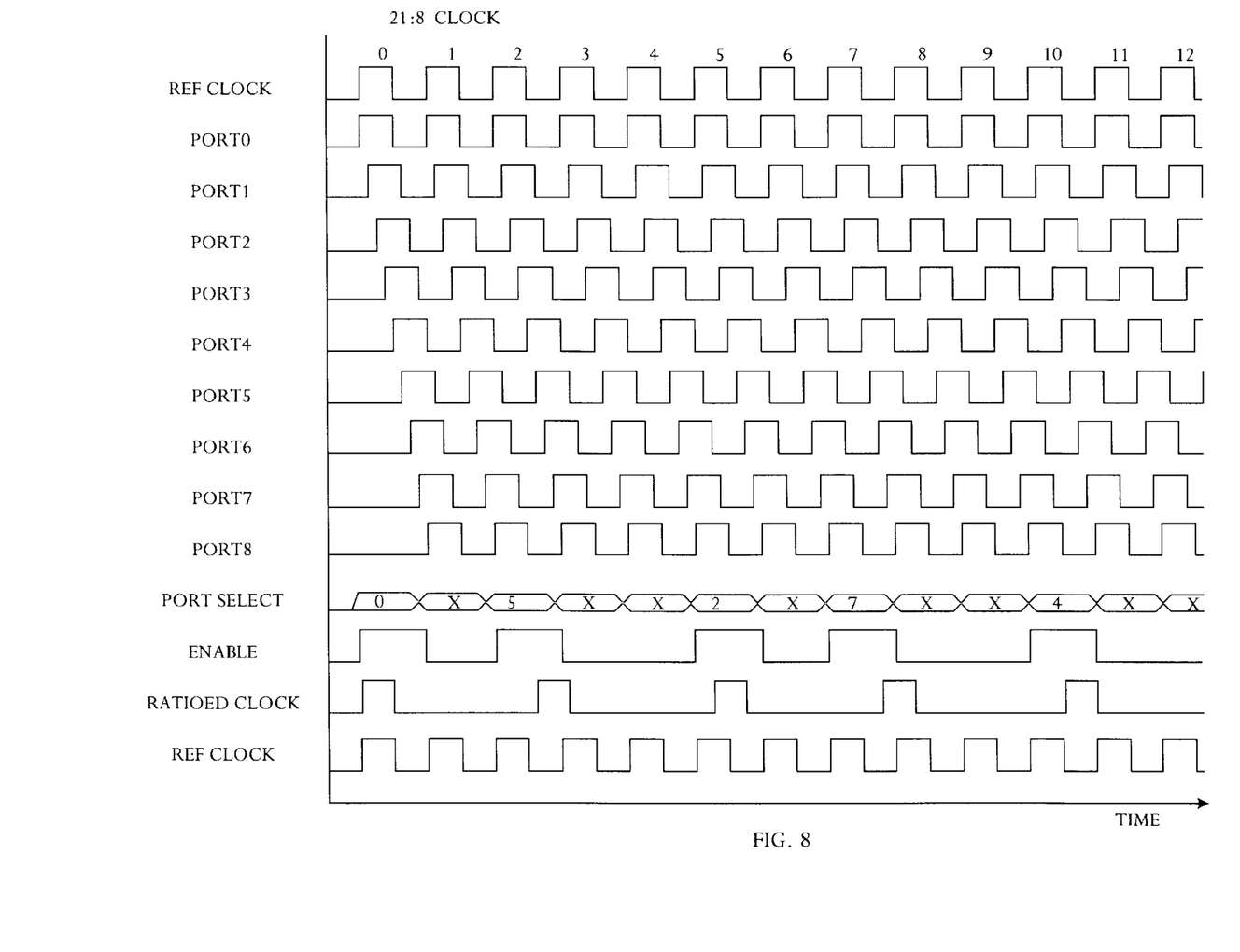

FIGS. 7 and 8 are sets of signal diagrams similar to those in FIG. 6. In FIG. 7 the frequency ratio is 16:8 (or 2:1), and the repeating sequence of port selections is "0,X". In FIG. 8, the ratio is 21:8, and the repeating sequence of port selections is "0, X, 5, X, X, 2, X, 7, X, X, 4, X, X, 1, X, 6, X, X, 3, X, X".

An algorithm for determining the repeating sequence of port selections for any given frequency ratio will now be described. Given a ratio M:N in reduced form where M>N, iterate the following algorithm:

Initialization:
Y:=0
Output Y.
Loop:
Perform integer division (Y+M)/N==>quotient Q and remainder R.
(i.e., Q=INT[(Y+M)/N] and R=REM[(Y+M)/N].)
Output (Q−1) X's.
Y:=R.
Output Y.
Repeat loop.

The output of this algorithm is the sequence of port select values that produce an M:N ratioed clock, provided that the enable is high except and until a port select value is X. The choice of 0 as the beginning value is arbitrary. Any other value between 0 and N−1 (inclusive) would work equally well. The output sequence of port select values is fully determined when Y equals the beginning value, because the sequence of port selection values is periodic. As an example, the algorithm can be verified to produce the repeating sequence of port selections "0, X, 5, X, X, 2, X, 7, X, X, 4, X, X, 1, X, 6, X, X, 3, X, X," corresponding to FIG. 8, when M=21 and N=8. That is, the frequency of the output ratioed clock has frequency that is a rational multiple of the frequency of the input clock signal REF CLK, wherein the rational multiple is 8/21.

Figure 9:
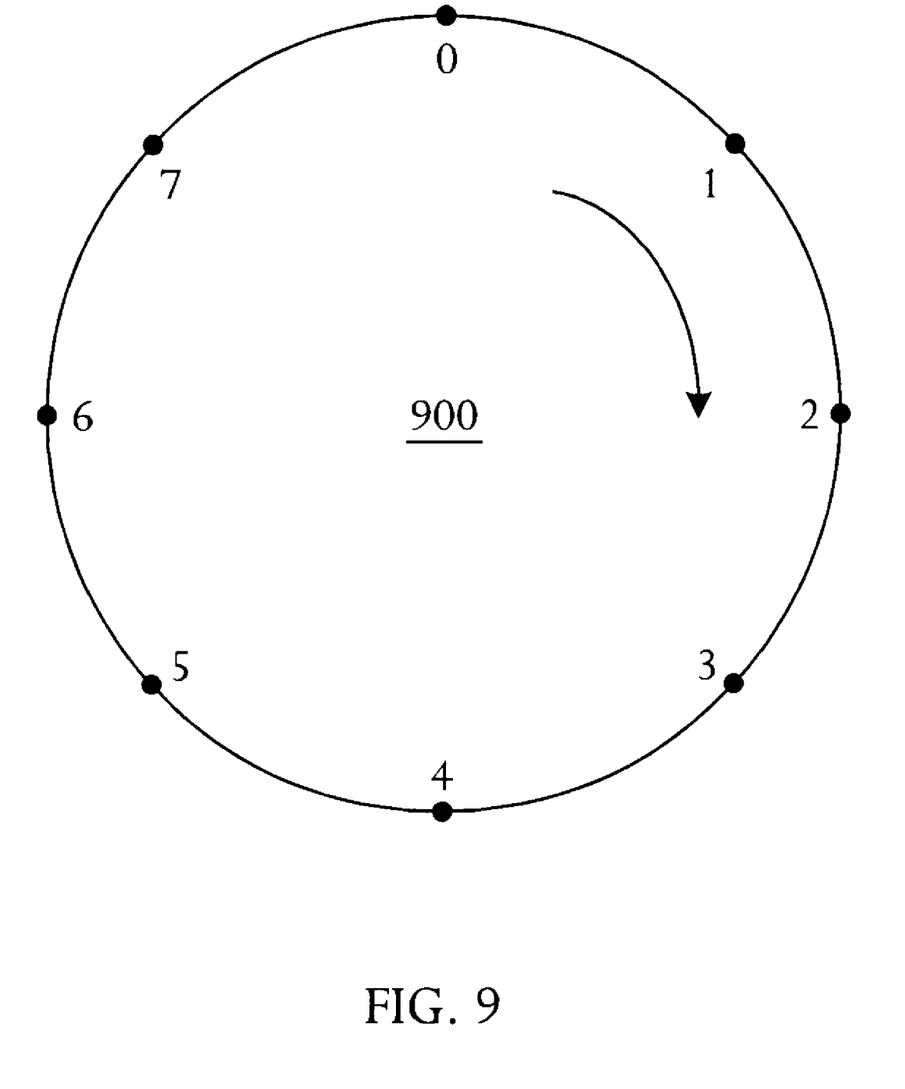
FIG. 9 depicts a modulo-8 ring useful for designing the digital circuitry of FIG. 5.

As another way to understand how the state machine 515 produces a desired sequence of port select values, consider a modulo-N ring (with points 0, 1, 2, . . . , N−1). The algorithm can be visualized on this ring by beginning at 0 as the first port selection in the sequence. Count forward (e.g., clockwise) M positions. In going forward M positions to the destination on the ring, add an "X" to the sequence for second and subsequent times 0 is passed. The destination is the next value in the sequence. Count forward M positions again, again adding X's as 0 is passed more than once. Repeat until the destination is 0. An example ring is illustrated in FIG. 9 for N=8. It is a simple matter to verify that counting forward by 11, 16 and 21, as just described, results in the repeating sequence of port selections for FIGS. 6–8, respectively.

Given N and a set of possible values for M, the state machine 515 is easily designed, according to techniques well known to those in the art, to produce the desired repeating sequence of port selections (and accompanying enable signal, which is always high except when the port selection is "X") for each input value of M, as set forth by the preceding algorithm.

Preferably the output clock signal has a frequency that is a rational multiple less than one (i.e., a fraction) of the frequency of the clock signal REF CLK. That is, M>N preferably. However, it is also possible to produce an output clock signal having a higher frequency than the reference clock signal. Because the signals input to the multiplexor 500 jointly have rising edges and falling edges everywhere within a resolution of one-eighth of the period of the signal REF CLK, it is possible to manipulate the port select line(s) of the multiplexor 500 in such a way as to pick any desired rising and/or falling edges from the possibilities presented, and thus synthesize a desired output clock. The operation of the state machine 515 with reference to FIGS. 6–8 picks rising edges from the possibilities presented. In an analogous manner, falling edges can also be selected, and the rising and falling edges can be so combined such that one or more adjacent pairs of rising and falling edges are within one half period of the reference clock REF CLK. In another alternative, the logic circuitry 500 can be discarded for logic circuitry of a different kind, to produce a faster output clock signal. For example, logic circuitry that performs the following operation would result in an output frequency twice that of the signal REF CLK: OUT CLK=(CLK0⊕CLK1)+ (CLK2⊕CLK 3), where "⊕" represents an exclusive OR (XOR) operation and "+" denotes an OR operation. Those skilled in digital logic design will appreciate these and other techniques for generating a higher rate output clock signal.

Although the logic circuitry 500 is shown as producing only a single output clock frequency, it can be replicated as many times as desired to produce a plurality of output clock signals. Those skilled in digital logic design will appreciate this and other techniques for generating a plurality of output clock signals.

As illustrated in FIGS. 6–8, the output clock signal has a duty cycle (defined as the temporal span of positive pulses over one period) less than 50%. As a result, the output clock signal has a DC (direct current) bias slightly less than if the duty cycle were 50%. This DC bias is not problematic in most cases. In situations were a 50% duty cycle is needed, additional logic can be added to accomplish this result. For example, selection of rising and falling edges, as described above in relation to higher output frequencies, can be exploited to achieve a balanced duty cycle. This and other techniques for adjusting the duty cycle are readily apparent to those skilled in the art.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. An apparatus comprising:
   a plurality of delay elements accepting, directly or indirectly, an input clock signal; and
   logic circuitry, connected to several of the plurality of delay elements and having an output, whereby the output is a clock signal having a frequency that is a rational multiple of the frequency of the input clock signal, wherein the rational multiple is less than one wherein the number of delay elements is N, and the frequency of the output clock signal is $(N/M) \times f_{REF}$, where M is a natural number, M>N, and $f_{REF}$ is the frequency of the clock signal fed through the plurality of delay elements.

2. The apparatus of claim 1 wherein the plurality of delay elements are sequentially connected.

3. The apparatus of claim 2 wherein each of the plurality of delay elements provides an equal delay.

4. The apparatus of claim 2 wherein the plurality of delay elements are directly connected in a loop.

5. The apparatus of claim 1 further comprising:
   a phase detector having at least two inputs and at least one output, a first of the inputs connected to one of the plurality of delay elements, a second of the inputs accepting a reference clock signal; and
   a feedback network, wherein the phase detector output is connected to the feedback network, so as to cause the first and second inputs to lock.

6. The apparatus of claim 5 wherein the phase detector and feedback network are part of a phase locked loop.

7. The apparatus of claim 5 wherein the phase detector and feedback network are part of a delay locked loop.

8. The apparatus of claim 1 wherein the logic circuitry comprises:
   a multiplexor having several signal inputs respectively connected to the several delay elements, having a port select input, and having an output;
   a state machine having a first output connected to the multiplexor port select input and having a second output; and
   a logic gate having a first input connected to the multiplexor output and a second input connected to the state machine second output, wherein the output of the logic gate is the output clock signal.

9. The apparatus of claim 8 wherein the logic gate is an edge sensitive AND gate.

10. The apparatus of claim 1 wherein the reference clock signal is a processor core clock signal and the output clock signal is an external bus clock signal.

11. The apparatus of claim 1 wherein the output clock signal is a binary clock signal of periodic rectangular pulses.

12. The apparatus of claim 1 wherein the output clock signal has a duty cycle less than 50%.

13. A method comprising:
   delaying a clock signal N times, where N is a natural number, whereby a number of delayed clock signals are produced;
   selecting a series of time splices of the delayed clock signals, so as to produce an output clock signal; and
   locking the clock signal to a reference clock signal wherein the frequency of the output clock signal is $(N/M) \times f_{REF}$, where M is a natural number and $f_{REF}$ is the frequency of the reference clock signal.

14. The method of claim 13 wherein the delaying step comprises delaying the clock signal N times sequentially.

15. The method of claim 13 wherein the locking step comprises phase locking.

16. The method of claim 13 wherein the locking step comprises delay locking.

17. A method comprising:
   delaying a clock signal N times, where N is a natural number, whereby a number of delayed clock signals are produced; and
   selecting a series of time splices of the delayed clock signals, so as to produce an output clock signal wherein the series of time splices of the delayed clock signals is a repeating sequence based on a modulo-N ring.

18. An apparatus comprising:
   a plurality of delay elements accepting, directly or indirectly, a reference clock signal $f_{REF}$; and
   logic circuitry, connected to one or more of the plurality of delay elements and having an output terminal, supplying a clock signal having a logic frequency that is a rational multiple (N/M) of the reference frequency $f_{REF}$, the logic circuitry selecting signals from delay elements 1 to N for a selected frequency ratio in a repeated sequence that can be determined by an iterative algorithm as follows:

Initialization:
   Y:=0;
   Output Y;
Loop:
   Perform integer division (Y+M)/N→quotient Q and remainder R;
   Output (Q−1)X's, where X is a "don't care" state;
   Y:R;
   Output Y;
   Repeat loop.

19. An apparatus comprising:
   a plurality of delay elements accepting, directly or indirectly, a reference clock signal $f_{REF}$; and
   means connected to several of the plurality of delay elements for generating an output timing signal as a selected combination of delayed reference clock signals, the output timing signal having a frequency that is a rational multiple of the frequency of the input clock signal, wherein for a number of delay elements N the frequency of the output clock signal is $(N/M) \times f_{REF}$, where M is a natural number.

20. An apparatus according to claim 19 wherein:
   the output timing signal frequency is less than the reference clock signal frequency $f_{REF}$.

21. An apparatus according to claim 19 wherein:
   the output timing signal frequency is greater than the reference clock signal frequency $f_{REF}$.

22. An apparatus according to claim 19 wherein:
   the apparatus generates a plurality of output timing signals.

* * * * *